US010428413B2

(12) United States Patent
Chen et al.

(10) Patent No.: US 10,428,413 B2
(45) Date of Patent: Oct. 1, 2019

(54) HYDROPHOBIC ALLOY FILM AND MANUFACTURING METHOD THEREOF

(71) Applicant: Industrial Technology Research Institute, Hsinchu (TW)

(72) Inventors: Tai-Sheng Chen, Kaohsiung (TW); Ming-Sheng Leu, Hsinchu County (TW); Wu-Han Liu, Miaoli County (TW); Jia-Jen Chang, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 528 days.

(21) Appl. No.: 14/981,972

(22) Filed: Dec. 29, 2015

(65) Prior Publication Data

US 2017/0175242 A1 Jun. 22, 2017

(30) Foreign Application Priority Data

Dec. 18, 2015 (TW) .............................. 104142746 A

(51) Int. Cl.
| | | |
|---|---|---|
| *C22F 1/18* | (2006.01) | |
| *C23F 17/00* | (2006.01) | |
| *C23C 4/18* | (2006.01) | |
| *C22F 1/057* | (2006.01) | |
| *C23C 14/58* | (2006.01) | |
| *C23C 4/134* | (2016.01) | |
| *C23C 4/08* | (2016.01) | |
| *C23C 4/06* | (2016.01) | |
| *C23C 14/14* | (2006.01) | |
| *C23C 14/35* | (2006.01) | |

(52) U.S. Cl.
CPC .............. *C22F 1/183* (2013.01); *C22F 1/057* (2013.01); *C23C 4/08* (2013.01); *C23C 4/134* (2016.01); *C23C 4/18* (2013.01); *C23C 14/5806* (2013.01); *C23F 17/00* (2013.01); *C23C 4/06* (2013.01); *C23C 14/14* (2013.01); *C23C 14/35* (2013.01)

(58) Field of Classification Search
CPC .......... C22F 1/057; C22F 1/183; C23C 14/14; C23C 14/35; C23C 14/5806; C23C 4/06; C23C 4/08; C23C 4/134; C23C 4/18; C23F 17/00
See application file for complete search history.

(56) References Cited

U.S. PATENT DOCUMENTS

| | | | |
|---|---|---|---|
| 833,851 | A | 10/1906 | Smith et al. |
| 6,103,023 | A | 8/2000 | Cyrot-Lackmann et al. |
| 6,254,700 | B1 | 7/2001 | Hermanek |
| 7,592,292 | B2 | 9/2009 | Tsai et al. |
| 8,338,351 | B2 | 12/2012 | Kanagasabapathy et al. |
| 2002/0079025 | A1* | 6/2002 | Symko ............... C22C 45/08 148/403 |
| 2004/0256236 | A1* | 12/2004 | Minevski ............ C25D 5/50 205/109 |
| 2013/0209898 | A1 | 8/2013 | Stamenkovic et al. |
| 2015/0075603 | A1 | 3/2015 | George et al. |

FOREIGN PATENT DOCUMENTS

| | | |
|---|---|---|
| CN | 1687471 | 10/2005 |
| CN | 1789480 | 6/2006 |
| CN | 101942630 | 7/2012 |
| CN | 104372300 | 2/2015 |
| TW | 593704 | 6/2004 |
| TW | I268275 | 12/2006 |
| TW | 201038635 | 11/2010 |

OTHER PUBLICATIONS

A stable Ti-based quasicrystal K. F. Kelton, W. J. Kim, and R. M. Stroud Appl. Phys. Lett. 70 (24), Jun. 16, 1997 (Year: 1997).*
Structural and Magnetic Properties of TiZrNi Thin Films Prepared by Magnetron Sputtering and Thermal Annealing Hyemin Shin, Soo-bin Choi, Ik-jae Lee, Chung Jong Yu, and Jae-yong Kim Journal of Nanoscience and Nanotechnology (Year: 2010).*
Selective hydrogenation of TieZreNi alloys A. Kocjan, S. Kovacic, A. Gradisek, J. Kovac, P.J. McGuiness, T. Apih, J. Dolinsek,,S. Kobe International Journal of Hydrogen Energy 36(2011)3056-3061 (Year: 2011).*
S. Pilotek, et al., "Wettability of Microstructured Hydrophobic Sol-Gel Coatings," Journal of Sol-Gel Science and Technology (Impact Factor: 1.53), vol. 26, Issue 1, Jan. 2003, pp. 789-792.
G.X. Shen, et al., "Study on a hydrophobic nano-TiO2 coating and its properties for corrosion protection of metals," Electrochimica Acta, vol. 50, Issue 25-26, Sep. 5, 2005, pp. 5083-5089.
Michael Thieme, et al., "Generation of Ultrahydrophobic Properties of Aluminium—A first Step to Self-cleaning Transparently Coated Metal Surfaces," Advanced Engineering Materials, vol. 3, Issue 9, Sep. 2001, pp. 691-695.
Akira Nakajima, et al., "Invited Review—Recent Studies on Super-Hydrophobic Films," Chemical Monthly, vol. 132, Issue 1, Jan. 1, 2001, pp. 31-41.
M. L. Zheludkevich, et al., "Sol-gel coatings for corrosion protection of metals," Journal of Materials Chemistry, vol. 15, Issue 48, Aug. 18, 2005, pp. 5099-5111.
"Office Action of Taiwan Counterpart Application", dated Apr. 13, 2016, p. 1-p. 6.

* cited by examiner

*Primary Examiner* — Jenny R Wu
(74) *Attorney, Agent, or Firm* — JCIPRNET

(57) ABSTRACT

A hydrophobic alloy film and a manufacturing method thereof are provided. The hydrophobic alloy film includes Al, Cu, O, and at least one selected from the group consisting of Fe, Co, Ni, and Cr, or Ti, Zr, O, and at least one selected from the group consisting of Fe, Co, Ni, and Cr. The content of each of Al and Ti is in the range of 40 at. % to 70 at. %. The content of each of Cu and Zr is in the range of 10 at. % to 40 at. %. The total content of at least one selected from the group consisting of Fe, Co, Ni, and Cr is in the range of 10 at. % to 30 at. %. The content of O is in the range of 10 at. % to 30 at. %. The hydrophobic alloy film has a quasicrystal structure and nanoparticles.

3 Claims, 4 Drawing Sheets

HYDROPHOBIC ALLOY FILM AND MANUFACTURING METHOD THEREOF

CROSS-REFERENCE TO RELATED APPLICATION

This application claims the priority benefit of Taiwan application serial no. 104142746, filed on Dec. 18, 2015. The entirety of the above-mentioned patent application is hereby incorporated by reference herein and made a part of this specification.

TECHNICAL FIELD

The disclosure relates to a hydrophobic alloy film and a manufacturing method thereof.

BACKGROUND

The surface properties of a material are important characteristics of a solid material, wherein the hydrophobicity of the surface of the material has received widespread attention and has been a subject of intensive research. This is due to the fact that a greater hydrophobicity of the surface of the material indicates water droplets roll on the surface of the material more readily, and therefore the surface of the material can have anti-sticking and self-cleaning effects.

Currently, most materials having hydrophobicity are fluoride polymer materials. However, the mechanical strength and the hardness of fluoride polymer materials are low, and therefore wear and peeling readily occur due to external force, such that hydrophobicity is lost. For instance, existing commercial cookware mostly achieve the effects of anti-sticking and easy cleaning by spray coating Teflon on the surface; however, many disadvantages exist in use, such as the Teflon coating layer is readily peeled off due to external force, thus causing harm to the human body.

Therefore, the development of an inorganic film having hydrophobicity, wear resistance, and corrosion resistance properties and simple manufacture is an important current topic.

SUMMARY

A hydrophobic alloy film of the disclosure includes Al, Cu, O, and at least one selected from the group consisting of Fe, Co, Ni, and Cr, or Ti, Zr, O, and at least one selected from the group consisting of Fe, Co, Ni, and Cr. The content of each of Al and Ti is in the range of 40 at. % to 70 at. %. The content of each of Cu and Zr is in the range of 10 at. % to 40 at. %. The total content of at least one selected from the group consisting of Fe, Co, Ni, and Cr is in the range of 10 at. % to 30 at. %. The content of O is in the range of 10 at. % to 30 at. %. The hydrophobic alloy film has a quasicrystal structure and nanoparticles.

A manufacturing method of a hydrophobic alloy film of the disclosure includes the following steps: forming an alloy material on a substrate, wherein the alloy material includes Al, Cu, and at least one selected from the group consisting of Fe, Co, Ni, and Cr, or Ti, Zr, and at least one selected from the group consisting of Fe, Co, Ni, and Cr, a content of each of Al and Ti is in the range of 40 at. % to 70 at. %, the content of each of Cu and Zr is in the range of 10 at. % to 40 at. %, the total content of at least one selected from the group consisting of Fe, Co, Ni, and Cr is in the range of 10 at. % to 30 at. %; and performing a heat treatment to form the alloy material into an alloy film, wherein the temperature of the heat treatment is in the range of 500° C. to 800° C.

BRIEF DESCRIPTION OF THE DRAWINGS

The accompanying drawings are included to provide a further understanding of the disclosure, and are incorporated in and constitute a part of this disclosure. The drawings illustrate embodiments of the disclosure and, together with the description, serve to explain the principles of the disclosure.

DETAILED DESCRIPTION OF DISCLOSED EMBODIMENTS

Figure 1:
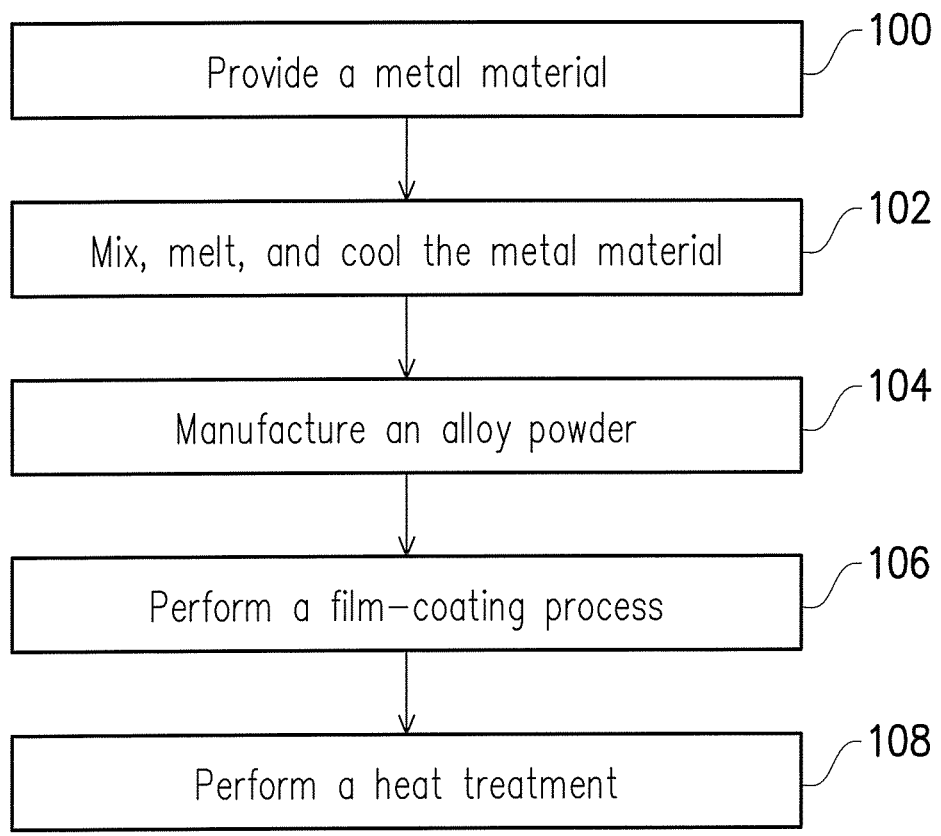
FIG. 1 is a flowchart of a manufacturing method of a hydrophobic alloy film according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An alloy film of an embodiment of the disclosure has a quasicrystal structure and nanoparticles, and therefore can have excellent hydrophobicity in comparison to a traditional metal film. Moreover, in comparison to a general polymer material having hydrophobicity, the hydrophobic film of an embodiment of the disclosure is formed by an alloy, and therefore has excellent mechanical strength (such as wear resistance and corrosion resistance properties). The hydrophobic alloy film of an embodiment of the disclosure is described in the following.

FIG. 1 is a flowchart of a manufacturing method of a hydrophobic alloy film according to an embodiment of the disclosure. Referring to FIG. 1, first, in step 100, a metal material needed for the manufacture of a hydrophobic alloy film of the disclosure is provided. The above metal material includes Al, Cu, and at least one selected from the group consisting of Fe, Co, Ni, and Cr, and the content of each of the components is decided according to the requirements of the formed alloy film. Specifically, in the formed alloy film, the content of Al is in the range of 40 at. % to 70 at. %, the content of Cu is in the range of 10 at. % to 40 at. %, and the total content of at least one selected from the group consisting of Fe, Co, Ni, and Cr is in the range of 10 at. % to 30 at. %. In other words, the formed alloy film is an Al—Cu alloy film, and at least one selected from the group consisting of Fe, Co, Ni, and Cr is doped therein. That is, the formed alloy film can be a ternary alloy (such as an Al—Cu—Fe alloy, an Al—Cu—Co alloy, an Al—Cu—Ni alloy, or an Al—Cu—Cr alloy), a quaternary alloy (such as an Al—Cu—Fe—Co alloy, an Al—Cu—Fe—Ni alloy, an Al—Cu—Fe—Cr alloy, an Al—Cu—Co—Ni alloy, an Al—Cu—Co—Cr alloy, or an Al—Cu—Ni—Cr alloy), a pentanary alloy (such as an Al—Cu—Fe—Co—Ni alloy, an Al—Cu—Fe—Co—Cr alloy, or an Al—Cu—Co—Ni—Cr alloy), or a hexanary alloy (such as an Al—Cu—Fe—Co—Ni—Cr alloy).

Alternatively, the above metal material includes Ti, Zr, and at least one selected from the group consisting of Fe, Co, Ni, and Cr, and the content of each of the components is decided according to the requirements of the formed alloy film. Specifically, in the formed alloy film, the content of Ti is in the range of 40 at. % to 70 at. %, the content of Zr is in the range of 10 at. % to 40 at. %, and the total content of at least one selected from the group consisting of Fe, Co, Ni, and Cr is in the range of 10 at. % to 30 at. %. In other words, the formed alloy film is a Ti—Zr alloy film, and at least one selected from the group consisting of Fe, Co, Ni, and Cr is doped therein. That is, the formed alloy film can be a ternary alloy (such as a Ti—Zr—Fe alloy, a Ti—Zr—Co alloy, a Ti—Zr—Ni alloy, or a Ti—Zr—Cr alloy), a quaternary alloy (such as a Ti—Zr—Fe—Co alloy, a Ti—Zr—Fe—Ni alloy, a Ti—Zr—Fe—Cr alloy, a Ti—Zr—Co—Ni alloy, a Ti—Zr—Co—Cr alloy, or a Ti—Zr—Ni—Cr alloy), a pentanary alloy (such as a Ti—Zr—Fe—Co—Ni alloy, a Ti—Zr—Fe—Co—Cr alloy, or a Ti—Zr—Co—Ni—Cr alloy), or a hexanary alloy (such as a Ti—Zr—Fe—Co—Ni—Cr alloy).

Then, in step 102, the above metal materials are mixed and a melting treatment is performed, and the melted materials are cooled to obtain an alloy target. The melting treatment is, for instance, arc melting, high-frequency melting, or resistance heating melting.

Then, in step 104, an alloy powder is manufactured using the above alloy target. The manufacturing method of the alloy powder includes, for instance, performing a water spray granulation treatment or a gas spray granulation treatment.

Then, in step 106, a film-coating process is performed using the above alloy powder to form an alloy material on the substrate. The substrate can be any required substrate, and the disclosure does not limit the substrate. For instance, the substrate can be a metal substrate (such as a Fe substrate, an Al substrate, or an Al alloy substrate), a ceramic substrate (such as a quartz substrate or a glass substrate), a polymer substrate, or a semiconductor substrate (such as a Si wafer). Moreover, before the film-coating process is performed, an organic solvent can be optionally used to remove the oil film and impurities on the surface of the substrate to ensure the quality of a subsequently-formed film layer. The above film-coating process is, for instance, melt spraying (such as plasma hot melt spraying, flame hot melt spraying, atmospheric plasma melt spraying, or cold plasma melt spraying) or physical vapor deposition (such as arc ion electroplating, magnetron sputtering, or high-energy pulse sputtering). In other words, an alloy material can be plated on the substrate via the above plating film process.

It should be mentioned that, in step 106, when performing film layer preparation, oxygen in the manufacture environment is also doped in the formed alloy material. In other words, in addition to containing Al, Cu, and at least one selected from the group consisting of Fe, Co, Ni, and Cr (or Ti, Zr, at last one selected from the group consisting of Fe, Co, Ni, and Cr), the formed alloy material also contains oxygen.

Then, in step 108, a heat treatment is performed on the alloy material formed on the substrate such that the alloy material is formed into the alloy film of an embodiment of the disclosure. The temperature of the above heat treatment is in the range of 500° C. to 800° C., and the duration of the above heat treatment is at least 60 minutes. The heat treatment is, for instance, an annealing treatment. In this step, since the heat treatment is performed on the above alloy material at a temperature in the range of 500° C. to 800° C., a quasicrystal structure is generated in the formed alloy film, and a nano precipitate is generated after cooling. The above nano precipitate is nanoparticles, and the particle size thereof is, for instance, in the range of 10 nm to 200 mm. Moreover, in the formed alloy film, the content of the quasicrystal structure is greater than 50%. The content of the quasicrystal structure is obtained by setting the XRD diffraction peak intensity of the quasicrystal powder to 100% and calculating the ratio of the XRD diffraction peak intensity of the alloy film.

It should be mentioned that, in step 108, when the heat treatment is performed, oxygen in the manufacture environment is also doped in the formed alloy film. In other words, in addition to containing Al, Cu, and at least one selected from the group consisting of Fe, Co, Ni, and Cr (or Ti, Zr, and at least one selected from the group consisting of Fe, Co, Ni, and Cr), the formed alloy film also contains oxygen. In the formed alloy film, the content of oxygen is in the range of 10 at. % to 30 at. % (containing oxygen doped in step 106 and/or step 108).

Since the formed alloy film has a quasicrystal structure and nanoparticles therein, and since the quasicrystal structure does not have a periodic arrangement, in addition to having excellent hydrophobicity (water contact angle in the range of 90° to 140°), the formed alloy film itself can further have higher hardness in comparison to a general polymer film or metal film, i.e., higher wear resistance and corrosion resistance properties. Moreover, since the formed alloy film has a quasicrystal structure, the alloy film can have lower surface energy and have good anti-sticking properties. In other words, the alloy film of an embodiment of the disclosure can have hydrophobicity and excellent wear resistance and corrosion resistance properties at the same time.

It should be mentioned that, if the temperature of the above heat treatment is lower than 500° C., then the content of the quasicrystal structure in the alloy film cannot be greater than 50%, such that the alloy film cannot have excellent wear resistance and corrosion resistance. Moreover, if the temperature of the above heat treatment is higher than 800° C., then a portion of the material (such as Al) in the alloy material is vaporized and the content thereof is reduced. As a result, the alloy film of an embodiment of the disclosure cannot be formed.

In the following, the manufacturing method of a hydrophobic alloy film of the disclosure is further described via experimental examples.

Experimental Example 1

Figure 2:
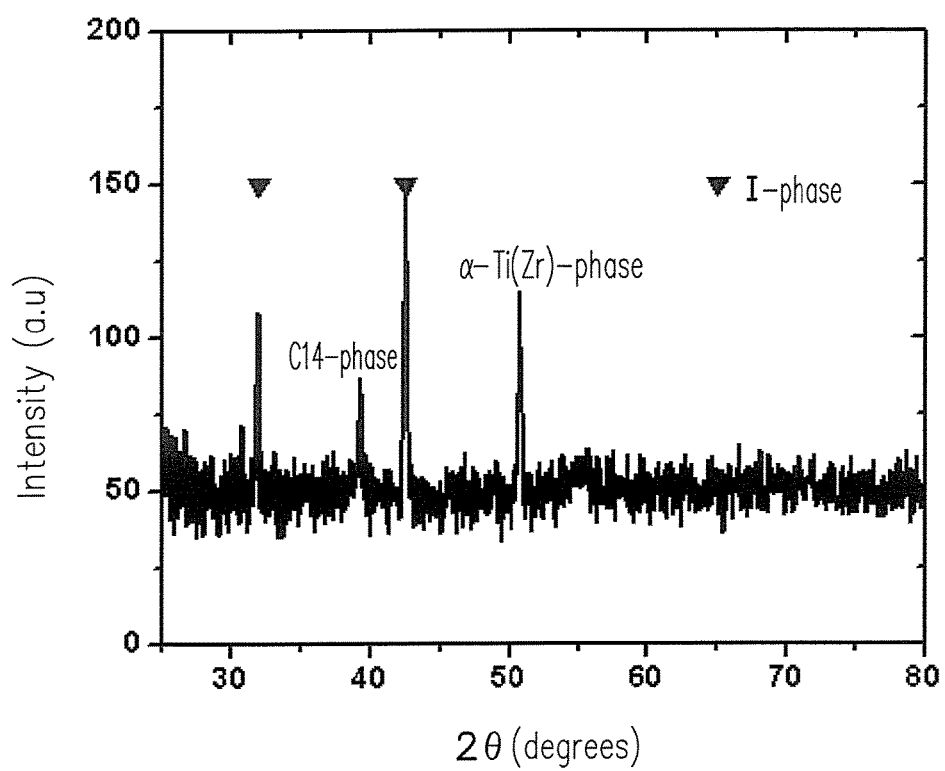
FIG. 2 is an X-ray diffraction diagram of a Ti—Zr—Ni film layer of the disclosure prepared using DC magnetron sputtering.

The Ti—Zr—Ni film layer of the disclosure was prepared using magnetron DC sputtering, and the X-ray diffraction diagram thereof is as shown in FIG. 2. It can be seen from FIG. 2 that the Ti—Zr—Ni film layer of the disclosure has an I-phase, an α-Ti(Zr)-phase, and a C14-phase, wherein the I-phase has a stronger signal, indicating that the film layer has more quasicrystal structures therein.

Figure 4:
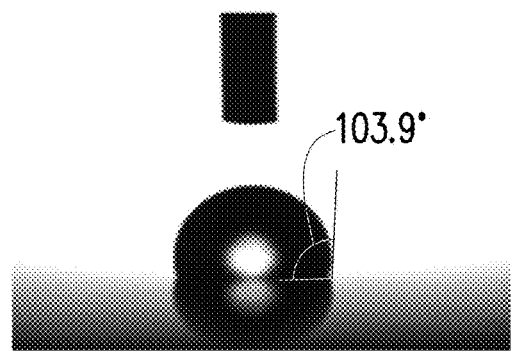
FIG. 4 is a contact angle diagram of a Ti—Zr—Ni film layer of the disclosure.

A water contact experiment was performed on the Ti—Zr—Ni film layer of the disclosure having the I-phase, the α-Ti(Zr) phase, and the C14-phase to obtain a water contact angle of about 103.9° (as shown in FIG. 4), and the water contact angle of a general stainless steel substrate is about 44.7°. It can therefore be known that, the alloy film of the disclosure can have a greater water contact angle, and also has excellent hydrophobicity and anti-sticking properties.

Moreover, a nanoindentation experiment was performed on the Ti—Zr—Ni film layer of the disclosure containing the I-phase, the α-Ti(Zr)-phase, and the C14-phase to measure the mechanical properties of the Ti—Zr—Ni film layer of the disclosure. The results show that the hardness of the Ti—Zr—Ni film layer of the disclosure reaches about 12 GPa, and the hardness of a general Ti alloy is about 4 GPa, and the hardness of a polymer material is less than 1 GPa. It can therefore be known that, the alloy film of the disclosure can have high hardness, and therefore has excellent wear resistance properties.

Moreover, a corrosion current experiment was performed on the Ti—Zr—Ni film layer of the disclosure containing the I-phase, the α-Ti(Zr)-phase, and the C14-phase. Under a 0.5 M sulfuric acid solution, it can be seen that the corrosion current of the Ti—Zr—Ni film layer of the disclosure is $3.22 \times 10^{-7}$ A/cm$^2$, and the corrosion current of a general stainless steel substrate is $7.32 \times 10^{-5}$ A/cm$^2$. It can therefore be known that, the alloy film of the disclosure can have excellent corrosion resistance properties.

Experimental Example 2

Figure 3:
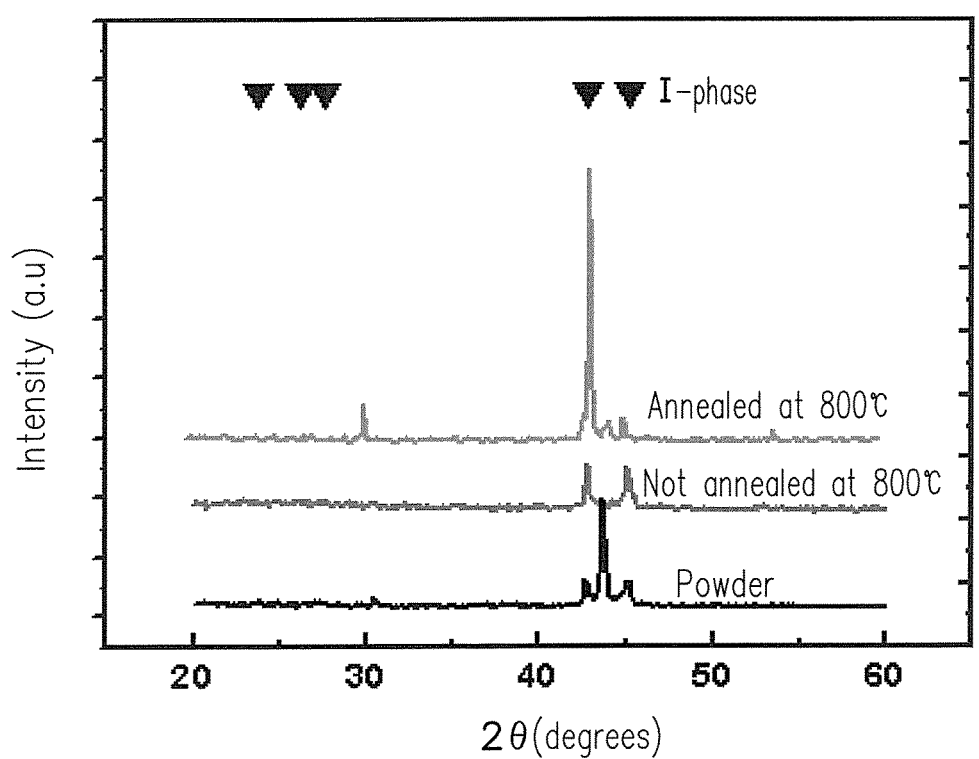
FIG. 3 is an X-ray diffraction diagram of a powder in the manufacturing process, a film layer not annealed at 800° C., and a film layer annealed at 800° C. of an Al—Cu—Fe film layer of the disclosure.

The Al—Cu—Fe film layer of the disclosure was prepared using plasma melt spray coating, and the X-ray diffraction diagram of a powder in the manufacturing process, a film layer not annealed at 800° C., and a film layer annealed at 800° C. is as shown in FIG. 3. It can be seen from FIG. 3 that, not only does the powder have an I-phase, the powder also has a β-phase, the powder only has the I-phase after melt spray coating without annealing at 800° C., and after annealing at 800° C., the diffraction intensity of the I-phase is significantly increased and the β-phase and other phases are generated. It can be known from the increase in the intensity signal of the I-phase that, the film layer annealed at 800° C. has more quasicrystal structures therein.

Figure 5:
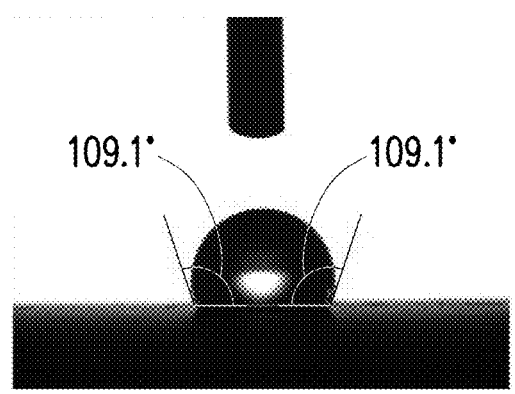
FIG. 5 and FIG. 6 are respectively contact angle diagrams of an Al—Cu—Fe film layer of the disclosure not annealed at 800° C. and annealed at 800° C.
Figure 6:
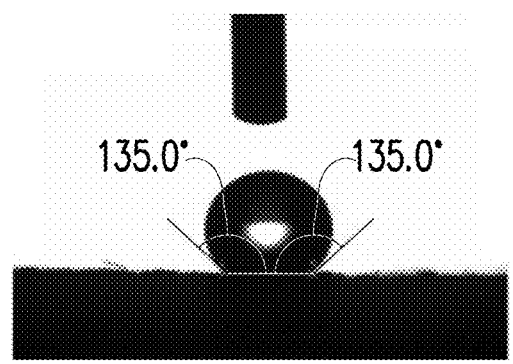

A water contact angle experiment was performed on the Al—Cu—Fe film layer not annealed at 800° C. and the Al—Cu—Fe film layer annealed at 800° C. prepared using plasma melt spray coating to obtain a water contact angle of about 109.1° for the Al—Cu—Fe film layer not annealed at 800° C. (as shown in FIG. 5) and a water contact angle of about 135.0° for the Al—Cu—Fe film layer annealed at 800° C. (as shown in FIG. 6), and the water contact angle of a general stainless steel substrate is about 44.7°. It can therefore be known that, the alloy film of the disclosure (prepared by melt spray coating) can have a greater water contact angle, i.e., has excellent hydrophobicity and anti-sticking properties.

The Al—Cu—Fe film layer not annealed at 800° C. and the Al—Cu—Fe film layer annealed at 800° C. prepared using plasma melt spray coating were observed under a secondary electron scanning electron microscope, and it can be seen that both have nanoparticles of about 10 nm to about 200 nm, and therefore the water contact angle of the Al—Cu—Fe film layer is increased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A hydrophobic alloy film, comprising:
Ti, Zr, O, and at least one selected from the group consisting of Fe, Co, Ni, and Cr,
wherein a content of Ti is in a range of 40 at. % to 70 at. %, a content of Zr is in a range of 10 at. % to 40 at. %, a total content of at least one selected from the group consisting of Fe, Co, Ni, and Cr is in a range of 10 at. % to 30 at. %, a content of O is in a range of 10 at. % to 30 at. %, and
the hydrophobic alloy film has a quasicrystal structure and nanoparticles, wherein a particle size of the nanoparticles is in a range of 10 nm to 200 nm.

2. The hydrophobic alloy film of claim 1, wherein a content of the quasicrystal structure is greater than 50% based on a XRD diffraction peak intensity of the quasicrystal structure relative to 100% of XRD diffraction peak intensity of the hydrophobic alloy film.

3. The hydrophobic alloy film of claim 1, wherein a water contact angle of the hydrophobic alloy film is in a range of 90° to 140°.

* * * * *